(12) United States Patent
Huang (10) Patent No.: US 11,798,930 B2
(45) Date of Patent: Oct. 24, 2023

(54) MODULE STRUCTURE AND ELECTRONIC APPARATUS

(71) Applicant: Shanghai Harvest Intelligence Technology Co., Ltd., Shanghai (CN)

(72) Inventor: Jiandong Huang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 161 days.

(21) Appl. No.: 17/384,511

(22) Filed: Jul. 23, 2021

(65) Prior Publication Data

US 2022/0028849 A1    Jan. 27, 2022

(30) Foreign Application Priority Data

Jul. 24, 2020  (CN) .......................... 202010727713.3
Jul. 24, 2020  (CN) .......................... 202021495266.5

(51) Int. Cl.
*H01L 25/18* (2023.01)
*G06V 40/13* (2022.01)
*H10K 50/854* (2023.01)

(52) U.S. Cl.
CPC .......... *H01L 25/18* (2013.01); *G06V 40/1318* (2022.01); *H10K 50/854* (2023.02)

(58) Field of Classification Search
None
See application file for complete search history.

(56) References Cited

U.S. PATENT DOCUMENTS

| 2010/0302185 | A1* | 12/2010 | Han | G06F 3/0425 345/173 |
| --- | --- | --- | --- | --- |
| 2017/0323144 | A1* | 11/2017 | Wu | B32B 7/12 |
| 2017/0372113 | A1* | 12/2017 | Zhang | H10K 50/854 |
| 2018/0005006 | A1* | 1/2018 | Chai | G06V 40/1318 |
| 2018/0005007 | A1* | 1/2018 | Du | G09G 3/3225 |
| 2018/0068157 | A1* | 3/2018 | Zeng | G06V 40/1376 |
| 2018/0076268 | A1* | 3/2018 | Wang | H10K 59/122 |
| 2018/0165498 | A1* | 6/2018 | Xie | G06V 40/1318 |
| 2021/0064836 | A1* | 3/2021 | Mori | G02F 1/13338 |

\* cited by examiner

*Primary Examiner* — Sue A Purvis
*Assistant Examiner* — Jordan M Klein
(74) *Attorney, Agent, or Firm* — Harness, Dickey & Pierce, P.L.C.

(57) ABSTRACT

The present disclosure provides a module structure and an electronic apparatus. The module structure includes: a sensing component, a sensing surface and a display component disposed between the sensing component and the sensing surface; an air layer disposed between the display component and the sensing component; and a scattering layer disposed between the air layer and the display component; wherein light generated by the display component is reflected or refracted on the sensing surface to form signal light carrying an information, and the signal light is transmitted through the scattering layer and the air layer and received by the sensing component. The present disclosure can realize decoupling between the sensing component and the display component, reduce the influence of a bonding stress on a display effect of the display component, and avoid the influence of the air layer on the realization of the function of the sensing component.

28 Claims, 6 Drawing Sheets

MODULE STRUCTURE AND ELECTRONIC APPARATUS

CROSS-REFERENCE TO RELATED APPLICATIONS

The present application claims the benefit of priority to Chinese patent application No. 202010727713.3, filed on Jul. 24, 2020, entitled "Module Structure And Electronic Apparatus", the entire disclosures of which are incorporated herein by reference.

The present application claims the benefit of priority to Chinese patent application No. 202021495266.5, filed on Jul. 24, 2020, entitled "Module Structure And Electronic Apparatus", the entire disclosures of which are incorporated herein by reference.

TECHNICAL FIELD

The present disclosure relates to the field of display technology, and more particularly to a module structure and an electronic apparatus.

BACKGROUND

Fingerprint imaging recognition technology collects a fingerprint image of a human body through a sensor, and then compares it with an existing fingerprint imaging information in a system to determine whether it is correct or not, and then realize an identity recognition. Because of its ease of use and uniqueness of human fingerprints, the fingerprint imaging recognition technology has been widely used in various fields. For example, security inspection areas such as Public Security Bureau and customs, building access control systems, and consumer goods areas such as personal computers and mobile phones, and so on. The fingerprint imaging recognition technology includes optical imaging, capacitance imaging, ultrasonic imaging and other technologies. Relatively speaking, the optical fingerprint imaging recognition technology has relatively good imaging effect and relatively low equipment cost.

With the combination of fingerprint imaging technology and a display panel, the fingerprint imaging function is integrated with the module structure, which can increase a display area and improve user experience.

However, in conventional technology, the module structure integrated with the optical fingerprint imaging technology needs to be improved, and the performance needs to be improved.

SUMMARY

Embodiments of the present disclosure provide a module structure and an electronic apparatus to reduce the dependency of a sensing panel on a display panel without affecting the function of the sensing panel.

An embodiment of the present disclosure provides module structure, including a sensing component, a sensing surface and a display component disposed between the sensing component and the sensing surface; an air layer, disposed between the display component and the sensing component; and a scattering layer, disposed between the air layer and the display component. Light generated by the display component is reflected or refracted on the sensing surface to form signal light carrying an information, and the signal light is transmitted through the scattering layer and the air layer and received by the sensing component.

In some embodiment, the scattering layer includes a random scattering layer or a microstructure layer.

In some embodiment, a relationship between a thickness D of the random scattering layer and a mean free path L of the random scattering layer is $0.1 \times L < D < 10 \times L$.

In some embodiment, the scattering layer is a transmission random scattering layer; a surface of the scattering layer far away from the display component is a rough surface; and/or the scattering layer is made of a material having a non-uniform refractive index distribution.

In some embodiment, the scattering layer includes a first substrate and scattering structures randomly distributed in the first substrate, and the first substrate has a refractive index different from that of the scattering structures.

In some embodiment, the scattering structures are distributed in the first substrate to achieve uniform optical scattering.

In some embodiment, the display component includes a second substrate, and the refractive index of the first substrate is equal to that of the second substrate of the display component.

In some embodiment, the scattering structures include bubbles or particles.

In some embodiment, the particles include at least one of particles made of a high-refractive-index dielectric material and metal particles.

In some embodiment, the first substrate is made of glass, polyimide, polyethylene terephthalate or silica gel.

In some embodiment, a diameter of each of the scattering structures is in a range from ⅕ of a wavelength of visible light to 100 times of the wavelength of the visible light.

In some embodiment, a density of the scattering structures in the scattering layer is in a range from 1 particle/cm³ to 1012 particles/cm³.

In some embodiment, a surface roughness of the rough surface of the scattering layer is in a range from 1/10 of a wavelength of visible light to 100 times of the wavelength of the visible light.

In some embodiment, the module structure further includes a periodic or aperiodic microstructure disposed on a surface of the microstructure layer far away from the display component; wherein the signal light transmitted through the microstructure layer is at least partially refracted on the microstructure.

In some embodiment, the microstructure is at least one of an inclined surface, a convex surface and a concave surface.

In some embodiment, the display component includes a substrate, and the scattering layer and the substrate of the display component are formed in one piece.

In some embodiment, the scattering layer is a thin film formed on the display component.

In some embodiment, the sensing component includes a photosensitive element configured for performing photoelectric conversion on the signal light.

In some embodiment, the module structure further includes: a converging module, disposed between the air layer and the sensing component to converge the signal light.

In some embodiment, the converging module includes a single lens, and the sensing component includes a CMOS image sensor.

In some embodiment, the converging module includes a lens group, and the sensing component includes a CMOS image sensor or a TFT sensor.

In some embodiment, a thickness of the air layer is in a range from 0 to 1 mm.

In some embodiment, the module structure further includes: at least one spacer, disposed between the scattering layer and the sensing component to form the air layer.

In some embodiment, the module structure further includes: a plurality of spacers, evenly distributed in a plane parallel to a surface of the sensing component.

In some embodiment, the module structure further includes: a plurality of spacers, wherein the plurality of spacers include a first spacer and a second spacer, and the first spacer and the second spacer have different heights.

In some embodiment, the display component includes a display panel, and the sensing component includes an image sensor panel.

In some embodiment, the display component includes a light-transmitting cover plate and a display layer, and the sensing surface is a surface of the light-transmitting cover plate.

Another embodiment of the present disclosure provides an electronic apparatus including the module structure according to any one of the preceding embodiments.

In some embodiment, the electronic apparatus includes a mobile phone, a tablet computer, or a smart watch.

Compared with conventional technologies, embodiments of the present disclosure have following beneficial effects.

According to some embodiment of the present disclosure, on the one hand, the air layer is disposed between the sensing component and the display component, and the sensing component and the display component are not completely attached to each other, which can effectively reduce the dependence between the sensing component and the display component, and achieve decoupling between the sensing component and the display component. Moreover, the incomplete attaching between the sensing component and the display component can also effectively reduce the influence of a stress on the display component after the sensing component and the display component are completely attached to each other. On the other hand, disposing the scattering layer between the air layer and the display component can effectively prevent the signal light from being totally reflected before transmitting through the air layer, which is beneficial for the signal light to enter the sensing component smoothly, and avoid the influence of the air layer on the function of the sensing component. Moreover, the scattering layer can also enable more light generated by the display component to be used for display, which is beneficial to improve the light extraction efficiency of the display component and improve the display effect of the display component.

According to some embodiment of the present disclosure, the scattering layer is a random scattering layer, and the thickness of the random scattering layer may be equal to the mean free path of the random scattering layer. Setting the thickness of the random scattering layer to be equal to its mean free path can effectively reduce the probability of multiple scattering of the signal light when transmitting through the scattering layer, which is beneficial to increase the probability of the signal light transmitting through the scattering layer and improve the photosensitive efficiency of the sensing component.

According to some embodiment of the present disclosure, the scattering layer includes the first substrate and scattering structures randomly distributed in the first substrate, and the mean free path of the random scattering layer is adjustable by setting the diameter, spacing and density of the scattering structures to improve the transmittance of the signal light and improve the photosensitive efficiency of the sensing component.

According to some embodiment of the present disclosure, the module structure further includes the converging module disposed between the air layer and the sensing component to converge the signal light. When the converging module includes a single lens, the CMOS image sensor with a smaller area can be used as the sensing component adapted to the display panel with a larger area. When the converging module includes a lens group, the CMOS image sensor or the TFT sensor with a larger area can be used as the sensing component adapted to the display panel with a larger area. The above solutions are beneficial to expand the application scenarios of the module structure.

According to some embodiment of the present disclosure, the spacer is disposed between the scattering layer and the sensing component to form the air layer, and the arrangement of the spacer can effectively ensure the stability of the thickness of the air layer, which is beneficial to ensure a stable performance of the sensing component.

According to some embodiment of the present disclosure, there are a plurality of spacers. The plurality of spacers include the first spacer and the second spacer, and the first spacer and the second spacer have different heights. The arrangement of the spacers having different heights can increase a pressure bearing capacity of the module structure while providing support to form the air layer, which is beneficial to prevent excessive deformation of the module structure.

DETAILED DESCRIPTION

As mentioned in the background, the module structure integrating display and fingerprint imaging in the conventional technology has the problem of excessive dependence between the display panel and the sensing panel.

In order to resolve above problem, the present disclosure provides a module structure. The module structure includes: a sensing component, a sensing surface and a display component disposed between the sensing component and the sensing surface; an air layer disposed between the display component and the sensing component; and a scattering layer disposed between the air layer and the display component. Light generated by the display component is reflected or refracted on the sensing surface to form signal light carrying an information, and the signal light is transmitted through the scattering layer and the air layer and received by the sensing component.

According to some embodiment of the present disclosure, on the one hand, the air layer is disposed between the sensing component and the display component, and the sensing component and the display component are not completely attached to each other, which can effectively reduce the dependence between the sensing component and the display component, and achieve decoupling between the sensing component and the display component. Moreover, the incomplete attaching between the sensing component and the display component can also effectively reduce the influence of a stress on the display component after the sensing component and the display component are completely attached to each other. On the other hand, disposing the scattering layer between the air layer and the display component can effectively prevent the signal light from being totally reflected before transmitting through the air layer, ensure the realization of the function of the sensing panel and avoid the influence of the air layer on the function of the sensing panel. Moreover, the scattering layer can also enable more light generated by the display component to be used for display, which is beneficial to improve the light extraction efficiency of the display component and improve the display effect of the display component.

In order to make above objectives, features and advantages of the present disclosure more obvious and understandable, specific embodiments of the present disclosure will be described in detail below with reference to the accompanying drawings.

Figure 1:
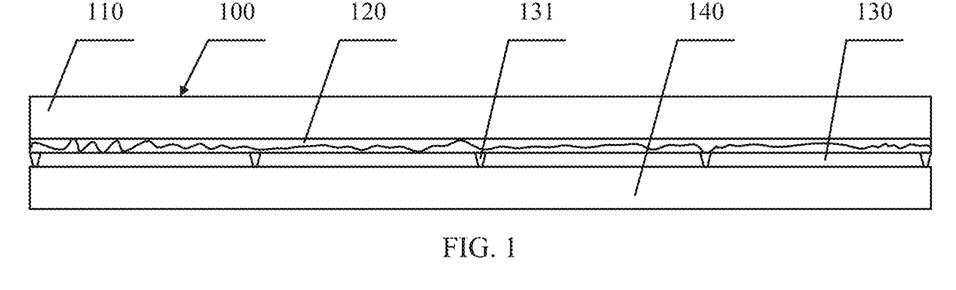
FIG. 1 is a schematic view showing a cross-sectional structure of a module structure according to a first embodiment of the present disclosure.

Referring to FIG. 1, a schematic view showing a cross-sectional structure of a module structure according to a first embodiment of the present disclosure is shown.

As shown in FIG. 1, the module structure includes: a sensing component, a sensing surface 100 and a display component disposed between the sensing component and the sensing surface. The module structure further includes an air layer 130 and a scattering layer 120. The air layer 130 is disposed between the display component and the sensing component, and the scattering layer 120 is disposed between the air layer 130 and the display component. Light generated by the display component is reflected or refracted on the sensing surface 100 to form signal light carrying an information, and the signal light is transmitted through the scattering layer 120 and the air layer 130 and projected to the sensing component. The sensing component collects the signal light and performs photoelectric conversion on the signal light. In some embodiment, the sensing component includes a sensing panel 140, and the display component includes a display panel 110.

On the one hand, the air layer 130 is disposed between the sensing panel 140 and the display panel 110, and the sensing panel 140 and the display panel 110 are not completely attached to each other, which can effectively reduce the dependence between the sensing panel 140 and the display panel 110, and achieve decoupling between the sensing panel 140 and the display panel 110. Moreover, the incomplete attaching between the sensing panel 140 and the display panel 110 can also effectively reduce the influence of the stress on the display panel 110 after the sensing panel and the display panel are completely attached to each other.

On the other hand, disposing the scattering layer 120 between the air layer 130 and the display panel 110 can effectively prevent the signal light from being totally reflected before transmitting through the air layer 130, which can ensure the realization of the function of the sensing panel 140, and avoid the influence of the air layer 130 on the function of the sensing panel 140. Moreover, the scattering layer 120 can also enable more light generated by the display panel to be used for display, which is beneficial to improve the light extraction efficiency of the display panel 110 and improve the display effect of the display panel 110.

Specific embodiments of the present disclosure will be described in detail below with reference to the accompanying drawings.

As shown in FIG. 1, the module structure includes the sensing panel 140, the sensing surface 100, and the display panel 110 disposed between the sensing panel 140 and the sensing surface 100.

The display panel 110 is suitable for static or dynamic display of images, so as to realize the image display function of the module structure.

In some embodiment, the display panel 110 is an OLED display panel. The display panel 110 includes a plurality of display pixels arranged in an array. The display pixels may include an anode layer, a hole injection layer (HIL), an emitting layer (EML), an electron injection layer (EIL), and a cathode layer and other structures, a hole transport layer (HTL), and an electron transport layer (ETL), and can also include structures such as TFT for driving OLED, driving metal lines, and storage capacitors. The display panel 110 can be implemented by using current specific technical solutions, which will not be repeated herein.

Figure 2:
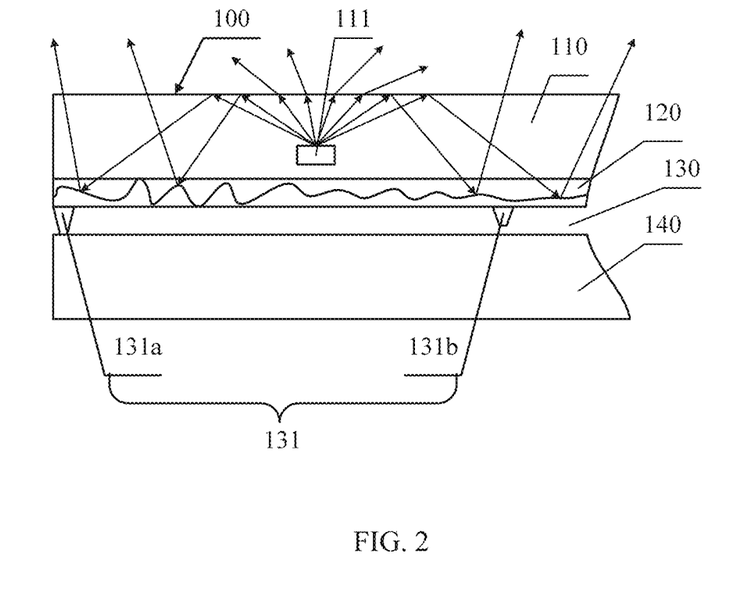
FIG. 2 is a schematic view showing an optical path for realizing a display function of the module structure shown in FIG. 1.

Referring to FIG. 2, a schematic view showing an optical path for realizing a display function of the module structure shown in FIG. 1 is shown.

The display panel 110 may include a display pixel array composed of a plurality of display pixels 111, and the light generated by the display pixels 111 is partially transmitted through the surface of the display panel 110 for display.

The sensing surface 100 is suitable for providing a contact surface. In some embodiment, the sensing surface 100 is a surface of the display panel 110.

In some embodiment, the display panel includes a light-transmitting cover plate and a display layer, or the display panel includes a light-transmitting cover plate, a touch screen, and a display layer. The sensing surface is a surface of the light-transmitting cover plate. The display layer may include an OLED display layer.

It should be noted that, in some embodiment, the sensing surface 100 is suitable for providing a contact surface to be contacted by a finger. Therefore, in addition to the display function, the module structure also integrates a fingerprint recognition function. In other embodiment of the present disclosure, the sensing surface may also provide a contact surface to be contacted by a palm, that is, the module structure also integrates a palmprint recognition function.

Figure 3:
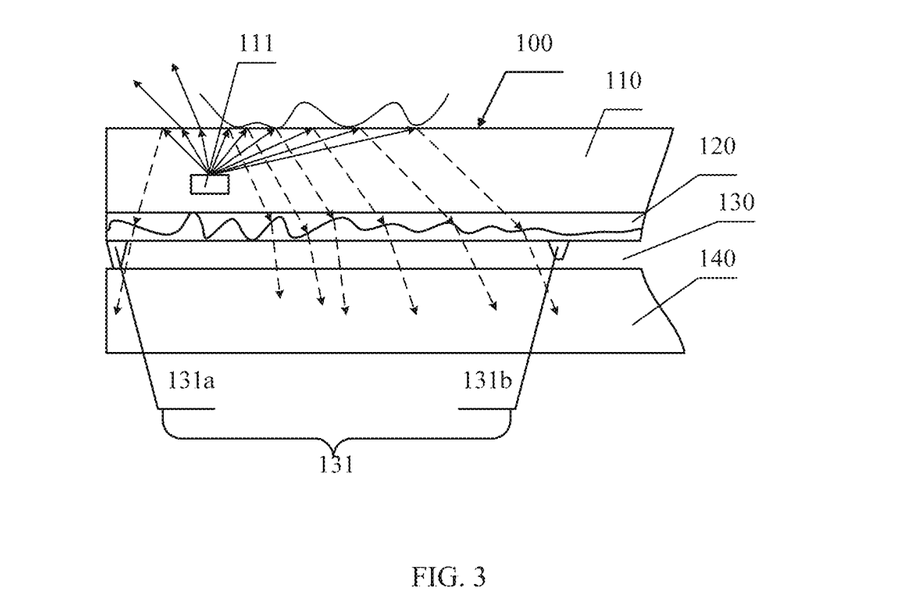
FIG. 3 is a schematic view showing an optical path for realizing a sensing function of the module structure shown in FIG. 1.

Referring to FIG. 3, a schematic view showing an optical path for realizing a sensing function of the module structure shown in FIG. 1 is shown.

The light generated by the display pixels 111 of the display panel 110 is partially reflected or refracted on the sensing surface 100 to form the signal light carrying an information (as shown by a dotted arrow in the figure).

In some embodiment, the sensing surface 100 provides a contact surface for the finger. Therefore, the light generated by the display pixels 111 is modulated by the fingerprint on the surface of the finger on the sensing surface 100, and the formed signal light carries a fingerprint information.

The sensing panel 140 is suitable for collecting signal light and performing photoelectric conversion on the signal light.

In some embodiment, the sensing panel 140 includes an image sensor panel. The sensing panel 140 includes a photoelectric device. After the signal light is projected onto the sensing panel 140, the photoelectric device in the sensing panel 140 performs photoelectric conversion on the signal light to obtain an image.

In some embodiment, the sensing panel 140 includes a TFT sensor. The TFT sensor includes a plurality of pixel regions, and each pixel region includes a pixel circuit and a photosensitive element. The pixel circuit includes a thin film transistor, and the photosensitive element includes a photodiode or a phototransistor. The pixel circuit can be used for scan driving and data transmission switch. The pixel circuit may include a plurality of thin film transistors.

In some embodiment, the photosensitive element of the TFT sensor may include a photosensitive thin film transistor. The photosensitive thin film transistor may include a gate, a source, a drain, an insulation layer and a light absorbing semiconductor layer. The photosensitive thin film transistor is an inverted coplanar structure, and the inverted coplanar structure includes the gate, the insulation layer and the source arranged vertically from bottom to top. The drain and the source are arranged coplanarly and laterally. The insulation layer wraps the gate so that there is no contact between the gate and the source, and between the gate and the drain. The source and the drain are assembled by clearance fit, and a photosensitive leakage current channel is formed laterally between the source and the drain. The light absorbing semiconductor layer is disposed in the photosensitive leakage current channel. A plurality of sources and a plurality of drains may be provided, the sources are connected in parallel, and the drains are connected in parallel. Specifically, a first gap is formed between adjacent sources, and one drain is disposed in the first gap. A second gap is formed between adjacent drains, and one source is disposed in the second gap. The source and the drain are alternately arranged and have a clearance fit. The light absorbing semiconductor layer may be an undoped intrinsic amorphous silicon structure, an undoped intrinsic microcrystalline silicon structure, or an amorphous germanium silicide structure, etc. The source and the drain may be a structure formed by an n-type doped semiconductor layer and a metal layer from top to bottom, and the n-type doped semiconductor layer means a semiconductor layer formed by chemical vapor deposition of silane, hydrogen and phosphine.

As shown in FIG. 3, in some embodiment, the light generated by the display pixels 111 is modulated by the fingerprint on the sensing surface 100 to form the signal light carrying the fingerprint information. The signal light is projected onto the sensing panel 140, and the sensing panel 140 performs photoelectric conversion on the signal light to obtain a fingerprint image.

Stilling referring to FIG. 1, the module structure further includes the air layer 130. The air layer 130 is disposed between the display panel 110 and the sensing panel 140.

The air layer 130 is suitable for making the display panel 110 and the sensing panel 140 incompletely adhered, so as to effectively reduce the dependence between the sensing panel 140 and the display panel 110, and realize decoupling between the sensing panel 140 and the display panel 110.

No matter in a device test condition or a working condition, when any one of the sensing panel 140 and the display panel 110 is damaged, the decoupling between the sensing panel 140 and the display panel 110 can improve the recovery rate of the undamaged device, thereby reducing the cost.

When the sensing panel 140 and the display panel 110 are completely adhered, a stress will be generated between the adhered film layers. The presence of the stress will cause stripes on the display panel 110, and thus affect the display effect of the display panel 110. Therefore, the incomplete adhering between the sensing panel 140 and the display panel 110 can avoid the generation of the stress, thus effectively improving the display effect of the display panel 110.

In some embodiment, the thickness of the air layer 130 is in a range from 0 to 1 mm. The purpose of setting the air layer 130 is mainly to form an isolation on the mechanical structure, so as to reduce the mechanical coupling between the sensing panel 140 and the display panel 110. However, the greater the thickness of the air layer 130, the longer the optical path through which the signal light passes through the air layer 130, the more severe the distortion of the image obtained by the sensing panel 140 from collecting the signal light, and the more serious the image distortion. Therefore, reasonable control of the thickness of the air layer 130 can effectively control the image distortion and reduce the degree of distortion, which is conducive to improving the image quality and reducing the difficulty of the later algorithm.

As shown in FIG. 1, in some embodiment, the module structure also includes at least one spacer 13. The spacer 131 is disposed between the scattering layer 120 and the sensing panel 140.

The spacer 131 is suitable for providing a support between the sensing panel 140 and the scattering layer 120 to form the air layer 130. With the air layer 130 formed by the spacer 131, the uniformity and stability of the air layer 130 can be effectively ensured, and the reliability and stability of the module structure can be effectively improved.

In some embodiment, there are a plurality of spacers 131, and the plurality of the spacers 131 are evenly distributed in a plane parallel to the surface of the sensing panel 140. When subjected to a pressure, the evenly distributed spacers 131 can make the pressure evenly distributed, which can effectively improve the anti-pressure capacity of the module structure.

As shown in FIG. 2 and FIG. 3, in some embodiment, the plurality of spacers 131 include a first spacer 131a and a second spacer 131b, and the first spacer 131a and the second spacer 131b have different heights. Setting spacers 131 with different heights can provide support while increasing the pressure bearing capacity and resilience of the module structure. When the sensing surface 100 is subjected to the pressure, the spacer 131 with a larger height (such as the first spacer 131a) deforms, until the spacer with a smaller height (such as the second spacer 131b) is subjected to the pressure, the supporting force received by the display panel 110 is significantly increased, thereby preventing excessive deformation of the display panel 110. Moreover, when the pressure is released, the display panel 110 bounces upward to restore its original shape under the joint action of all the spacers 131.

In some embodiment, the spacer 131 can be realized by a mechanical structure or a clamp, and the spacer 131 can be customized according to tolerances.

Still referring to FIG. 1, the module structure further includes a scattering layer 120 disposed between the air layer 130 and the display panel 110.

The scattering layer 120 is suitable for destroying the total reflection condition of light. Moreover, as shown in FIG. 2, part of the light generated by the display panel 110 is reflected on the sensing surface 100 and propagates in a direction away from the sensing surface 100. The scattering layer 130 can make part of the light propagating in the direction away from the sensing surface 100 reflect and propagate towards the sensing surface 100 again. Therefore, the arrangement of the scattering layer 130 can effectively improve the light extraction efficiency of the display panel 110, which is conducive to improving the display effect of the display panel 110.

In addition, as shown in FIG. 3, the arrangement of the scattering layer 120 destroys the total reflection condition of the signal light, thereby effectively avoiding total reflection of the signal light before transmitting through the air layer 130, and ensuring that the signal light can transmit through the scattering layer 120 and the air layer 130 to be projected to the sensing panel 140 to realize the function of the sensor panel 140 to collect information light and obtain images.

In some embodiment, the scattering layer 120 is a random scattering layer, that is, the probability of the signal light being reflected and refracted on the scattering layer 120 is random. The random scattering layer may be a random scattering film.

Figure 4:
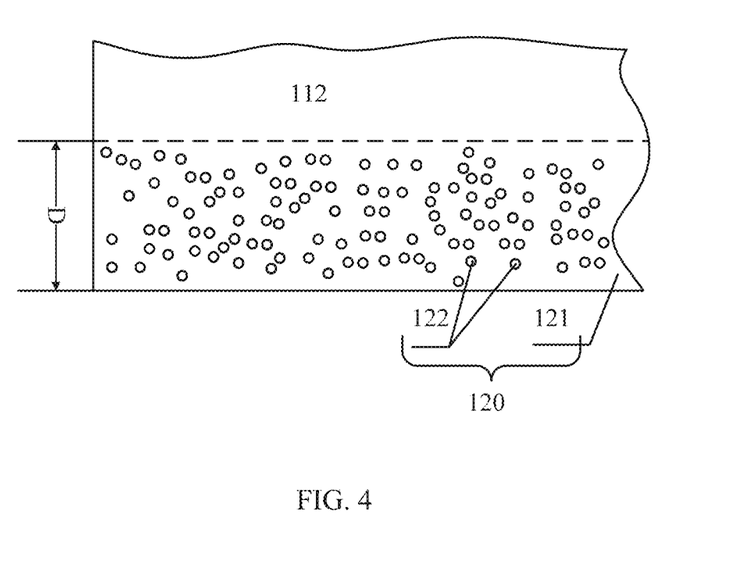
FIG. 4 is a schematic view showing an enlarged structure of a portion of a scattering layer of the module structure shown in FIG. 1.

Referring to FIG. 4, a schematic view showing an enlarged structure of a portion of a scattering layer of the module structure shown in FIG. 1 is shown.

As shown in FIG. 4, in some embodiment, the scattering layer is a transmission random scattering layer. The scattering layer 120 is made of a material having a non-uniform refractive index distribution. The signal light is refracted in the process of transmitting through the random scattering layer to change the propagation direction. Specifically, the scattering layer 120 includes a first substrate 121 and scattering structures 122 randomly distributed in the first substrate 121, and the first substrate 121 and the scattering structures 122 have different refractive indexes.

Specifically, as shown in FIG. 4, the scattering structures 122 are distributed in the first substrate 121 to achieve uniform optical scattering, so that the signal light can transmit with a similar probability when the signal light is projected to any part of the scattering layer 120, thereby effectively improving the quality of the image obtained by the sensing panel 140.

In some embodiment, the refractive index of the first substrate 121 is equal to that of a second substrate 112 of the display panel 110, so as to prevent the signal light from being refracted, reflected or totally reflected on the surface of the scattering layer 120 towards the display panel 110, enable the signal light to be smoothly projected into the scattering layer 120 from the display panel 110, and reduce the distortion of the image obtained by the sensing panel 140 and improve the image quality. Specifically, the display panel 110 is an OLED display panel, the second substrate 112 of the display panel 110 is made of glass, and the refractive index of the first substrate 121 of the scattering layer 120 is the same as that of the glass. The material of the first substrate 121 of the scattering layer 120 is the same as that of the second substrate 112 of the display panel 110, that is, glass.

In some embodiment, the scattering structures 122 are made of a material having a low refractive index, such as bubbles. In other embodiments of the present disclosure, the scattering structures may also be small particles of a medium material having a high refractive index, such as $TiO_2$ particles. In other embodiments of the present disclosure, the scattering structures may also be small metal particles, such as gold nanostructured particles or silver nanostructured particles, and other precious metal particles with strong plasma scattering effect.

In some embodiment of the present disclosure, the scattering layer 120 may be an integral structure with the second substrate 112 of the display panel 110. Specifically, the second substrate 112 of the display panel 110 is made of glass, the first substrate 121 of the scattering layer 120 is also made of glass, and the scattering structures 122 are bubbles randomly distributed in the glass. The arrangement of the integrated structure can avoid the generation of an interface between the scattering layer 120 and the second substrate 112 of the display panel 110, reduce the reflection or refraction of the signal light at the interface, and reduce the image distortion and realize signal light transmission.

It should be noted that in other embodiments of the present disclosure, the second substrate 112 of the display panel 110 may also be made of polyimide, and the first substrate of the scattering layer may also be made of polyimide. In other embodiments of the present disclosure, the first substrate of the scattering layer may also be made of polyethylene terephthalate or silica gel.

It should also be noted that in other embodiments of the present disclosure, the scattering layer 120 may be a thin film layer adhered to the surface of the second substrate 112 of the display panel 110, such as a scattering film. The method of adhering the scattering layer 120 on the surface of the second substrate 112 of the display panel 110 does not need to change the second substrate 112 of existing display panel 110, which facilitates process integration and cost control.

In some embodiment, a diameter of the scattering structures 122 is in a range from ⅕ to 100 times of a wavelength of the visible light. By reasonably setting the diameter of the scattering structures 122, more signal light generated by the light generated by the display panel 110 is projected onto the sensing panel 140, thus the quality of the image obtained by the sensing panel 140 can be effectively guaranteed, and the influence of the air layer 130 on the image quality of the sensing panel can be effectively controlled.

It should be noted that when the size of the scattering structures 122 is much smaller than the wavelength of the signal light, the scattering in the scattering layer 120 is mainly Rayleigh scattering. The scattering layer 120 has strong wavelength selectivity for the transmitted signal light, that is, the scattering layer 120 has high transmittance for the signal light of a specific wavelength. Thus, the scattering layer 120 enables the signal light in a suitable wavelength range to transmit through according to a wavelength response characteristic of the sensing panel 140 to obtain high-quality images. When the size of the scattering structures 122 is larger than the wavelength of the signal light, the selectivity of the scattering layer 120 for the transmitted signal light is greatly reduced. Therefore, when a range of the wavelength response characteristic of the sensing panel 140 is wide, the light intensity of the signal light transmitted through the scattering layer 120 can be effectively improved, which is beneficial to obtaining high-quality images.

In addition, according to scattering property, the radius of scattering structures 122 is defined as r, and the scattering area of scattering structures 122 is defined as $\pi r^2$. The scattering property is determined by the mean free path of the photon in the scattering layer 120. The mean free path refers to an average value of each free path that the photon may pass between two adjacent scattering events in the scattering layer 120. The mean free path L can be defined as:

$$L = \frac{1}{\text{scattering area} \times \text{Number (volume) density of particles}}$$

In some embodiment, the relationship between a thickness D of the random scattering layer (i.e., the scattering layer 120) and the mean free path L of the random scattering layer is approximately $0.1 \times L < D < 10 \times L$. Specifically, the thickness D of the random scattering layer (as shown in FIG. 4) may be equal to the mean free path L of the random scattering layer. This arrangement can cause the signal light to be scattered only once when transmitting through the scattering layer 120, and minimize the probability of multiple scattering when the signal light is transmitted through the scattering layer 120.

According to the above relationship between the mean free path L and the scattering area and the density of the scattering structures, the material and density of the scattering structures 122 can be adjusted to reasonably configure the mean free path and thickness of the scattering layer 120 to meet design requirements. Specifically, in some embodiment, the density of the scattering structures 122 in the scattering layer 120 is in a range from 1 particle/cm$^3$-10$^{12}$ particles/cm$^3$.

Figure 5:
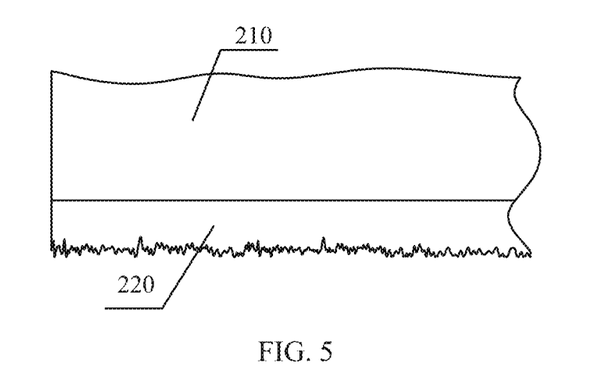
FIG. 5 is a schematic view showing an enlarged structure of a portion of a scattering layer of a module structure according to a second embodiment of the present disclosure.

In some embodiment, the random scattering layer is a scattering layer having a non-uniform refractive index distribution. As shown in FIGS. 1 to 3, a wavy line in the scattering layer 120 indicates that the refractive index distribution of the scattering layer 120 is uneven. In other embodiments of the present disclosure, as shown in FIG. 5, the surface of a scattering layer 220 far away from a display panel 210 is a rough surface. The signal light propagating in the scattering layer 220 is refracted and reflected on the rough surface to exit and then is projected onto the sensing panel (not shown in the figure).

It should be noted that a surface roughness of the rough surface of the scattering layer 220 is in a range from 1/10 of the wavelength of the visible light to 100 times of the wavelength of the visible light, so that more light generated by the display panel 210 is projected onto the sensing panel, which can effectively ensure the quality of the image obtained by the sensing panel, and can effectively control the influence of the air layer on the image quality of the sensing panel.

It should also be noted that, in the foregoing embodiments, the scattering layer is a random scattering layer. In other embodiments of the present disclosure, the scattering layer may also be a microstructure layer. Specifically, a periodic or aperiodic microstructure is disposed on the surface of the microstructure layer far away from the display panel, and at least part of the light transmitting through the microstructure layer is refracted on the microstructure.

Figure 6:
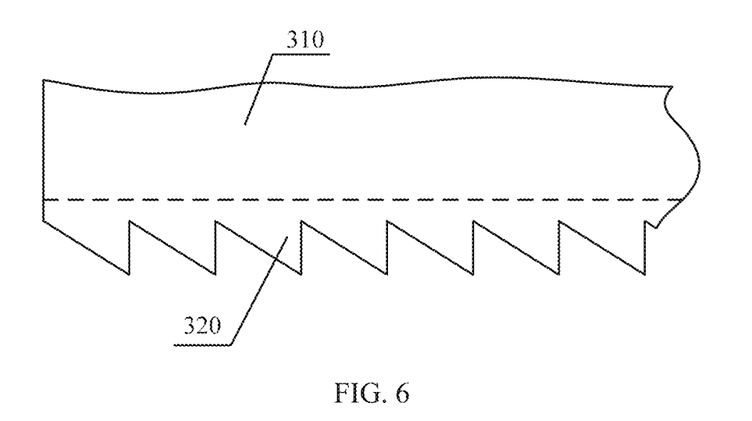
FIG. 6 is a schematic view showing an enlarged structure of a portion of a scattering layer of a module structure according to a third embodiment of the present disclosure.
Figure 7:
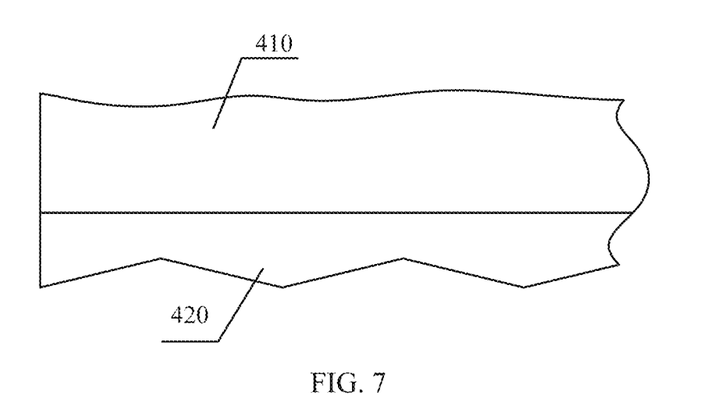
FIG. 7 is a schematic view showing an enlarged structure of a portion of a scattering layer of a module structure according to a fourth embodiment of the present disclosure.
Figure 8:
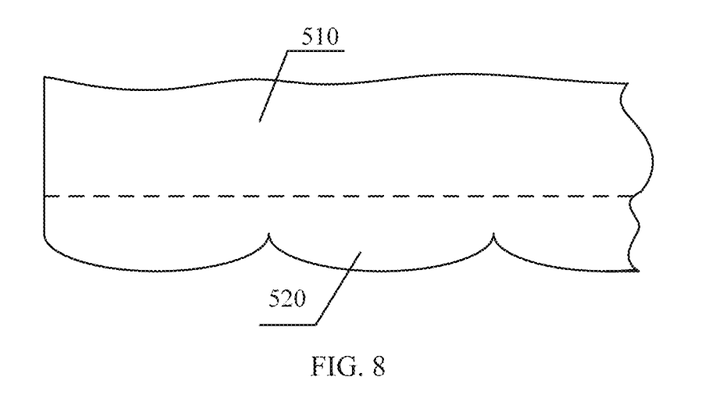
FIG. 8 is a schematic view showing an enlarged structure of a portion of a scattering layer of a module structure according to a fifth embodiment of the present disclosure.
Figure 9:
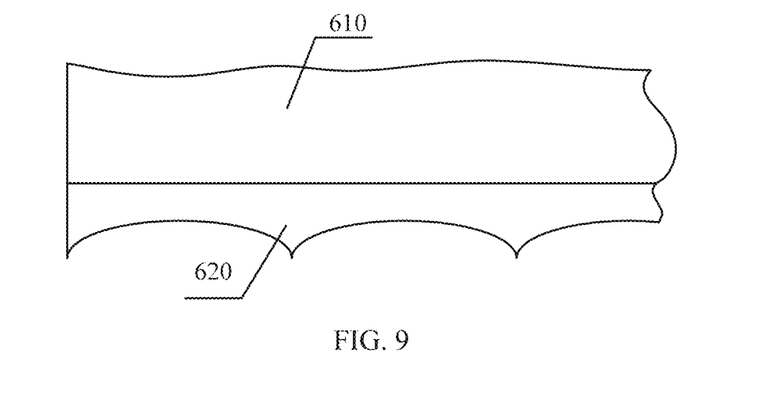
FIG. 9 is a schematic view showing an enlarged structure of a portion of a scattering layer of a module structure according to a sixth embodiment of the present disclosure.

Referring to FIGS. 6 to 9, the microstructure may be at least one of an inclined plane (for example, a microstructure layer 320 integrated with a display panel 310 in FIG. 6 and a microstructure layer 420 attached to a display panel 410 in FIG. 7), a convex surface (for example, a microstructure layer 520 integrated with the display panel 510 in FIG. 8), and a concave surface (for example, a microstructure layer 620 attached to a display panel 610 in FIG. 9).

It should be noted that in FIGS. 4 to 9, a dotted line indicates the integrated structure of the microstructure layer and the display panel (as shown in FIGS. 4, 6 and 8), and a solid line indicates that the microstructure layer is attached to the display panel (as shown in FIGS. 5, 7 and 9).

Figure 10:
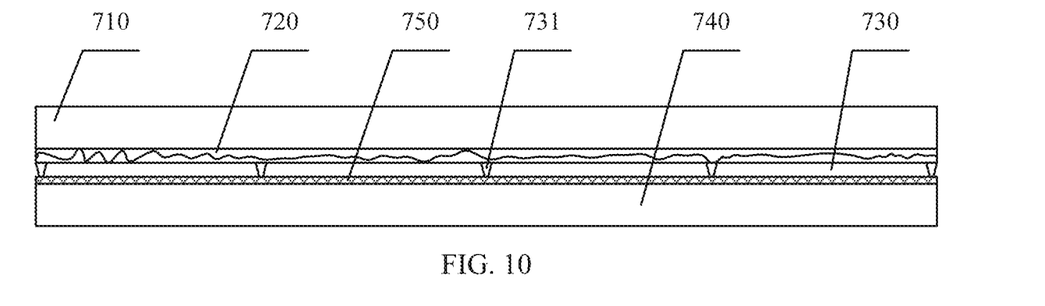
FIG. 10 is a schematic view showing a cross-sectional structure of a module structure according to a seventh embodiment of the present disclosure.

Referring to FIG. 10, a schematic view showing a cross-sectional structure of a module structure according to a seventh embodiment of the present disclosure is shown. The module structure includes a display panel 710, a scattering layer 720 and at least one spacer 731.

The same features between this embodiment and previous embodiments are not repeated here. The difference between this embodiment and previous embodiments is that, in this embodiment, the module structure further includes a converging module 750. The converging module 750 is disposed between an air layer 730 and a sensing component 740 to converge the signal light.

The converging module 750 can collect light within a specific angle, which can effectively improve the utilization rate of the signal light, and improve the quality of the image obtained by the sensing component 740.

In some embodiment, the converging module 750 may include a lens array, which may be mainly designed with a short focal length. The lens array may be a microlens array. The sensing component includes a large-area CMOS image sensor or a TFT sensor. The TFT sensor includes a plurality of pixel regions, and each pixel region includes a pixel circuit and a photosensitive element. The pixel circuit includes a thin film transistor, and the photosensitive element includes a photodiode or a phototransistor. The pixel circuit can be used for scanning drive and data transmission switch.

Figure 11:
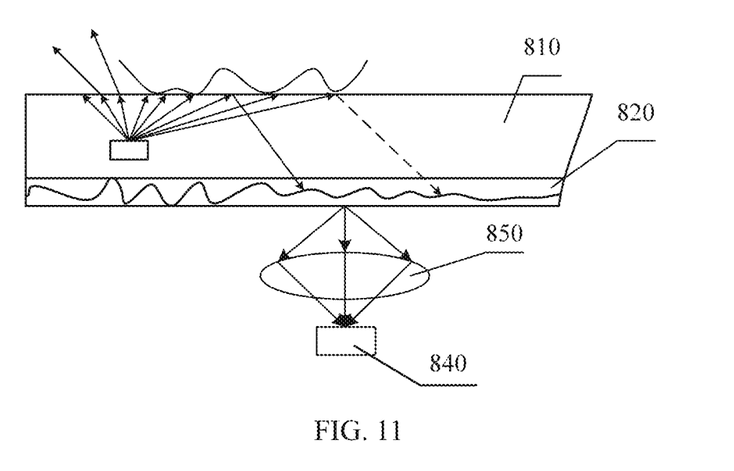
FIG. 11 is a schematic view showing a cross-sectional structure of a module structure according to an eighth embodiment of the present disclosure.

Referring to FIG. 11, a schematic view showing a cross-sectional structure of a module structure according to an eighth embodiment of the present disclosure is shown.

The same features between this embodiment and previous embodiments are not repeated here. The difference between this embodiment and previous embodiments is that, in this embodiment, the module structure further includes a converging module 850. The converging module 850 includes a single lens, and a sensing component 840 may be a CMOS image sensor. Utilizing a magnification effect of the single lens, a small-area CMOS image sensor can be used to achieve a large-area coverage, so as to be compatible with a larger-area display panel 810, which is conducive to expanding the application scenarios of the module structure.

In some embodiment, the single lens and the CMOS image sensor may be disposed in a middle area or an edge area of a space below the display component 810, and the plane where the CMOS image sensor is disposed in may be parallel to or at a preset angle to the surface of the display component 810 to achieve short focal length focusing.

In some embodiment, with the arrangement of a scattering layer 820, the light intensity of the signal light can be enhanced, thereby improving the signal-to-noise ratio of the fingerprint image collected by the module structure.

In some embodiment of the present disclosure, the module structure may further include a controller and a processor. The controller may be used to drive the display pixels of the display component to emit light, and the processor may be used to process the signals collected by the sensing component to obtain the fingerprint images.

Another embodiment of the present disclosure further provides an electronic apparatus. The electronic apparatus includes the module structure according to any one of the foregoing embodiments of the present disclosure. The electronic apparatus may be a mobile phone, a tablet computer or a smart watch, etc. The module structure may be used for fingerprint authentication of the electronic apparatus, for example, a user can unlock a screen or an application program through fingerprint authentication, or conduct an online payment transaction.

According to some embodiment of the present disclosure, on the one hand, the air layer is disposed between the sensing component and the display component, and the sensing component and the display component are not completely attached to each other, which can effectively reduce the dependence between the sensing component and the display component, and achieve decoupling between the sensing component and the display component. Moreover, the incomplete attaching between the sensing component and the display component can also effectively reduce the influence of a stress on the display component after the sensing component and the display component are completely attached to each other. On the other hand, disposing the scattering layer between the air layer and the display component can effectively prevent the signal light from being totally reflected before transmitting through the air layer, which is beneficial for the signal light to enter the sensing component smoothly, and avoid the influence of the air layer on the function of the sensing component. Moreover, the scattering layer can also enable more light generated by the display component to be used for display, which is beneficial to improve the light extraction efficiency of the display component and improve the display effect of the display component.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A module structure, comprising:
   a sensing component, a sensing surface and a display component disposed between the sensing component and the sensing surface;
   an air layer, disposed between the display component and the sensing component; and
   a scattering layer, disposed between the air layer and the display component;
   wherein light generated by the display component is reflected or refracted on the sensing surface to form signal light carrying an information, and the signal light is transmitted through the scattering layer and the air layer and received by the sensing component.

2. The module structure according to claim 1, wherein the scattering layer comprises a random scattering layer or a microstructure layer.

3. The module structure according to claim 2, wherein the scattering layer is a transmission random scattering layer;
   a surface of the scattering layer far away from the display component is a rough surface; and/or
   the scattering layer is made of a material having a non-uniform refractive index distribution.

4. The module structure according to claim 3, wherein the scattering layer comprises a first substrate and scattering structures randomly distributed in the first substrate, and the first substrate has a refractive index different from that of the scattering structures.

5. The module structure according to claim 4, wherein the scattering structures are distributed in the first substrate to achieve uniform optical scattering.

6. The module structure according to claim 4, wherein the display component comprises a second substrate, and the refractive index of the first substrate is equal to that of the second substrate of the display component.

7. The module structure according to claim 4, wherein the scattering structures comprise bubbles or particles.

8. The module structure according to claim 7, wherein the particles comprise at least one of particles made of a high-refractive-index dielectric material and metal particles.

9. The module structure according to claim 4, wherein the first substrate is made of glass, polyimide, polyethylene terephthalate or silica gel.

10. The module structure according to claim 4, wherein a diameter of each of the scattering structures is in a range from $1/5$ of a wavelength of visible light to 100 times of the wavelength of the visible light.

11. The module structure according to claim 4, wherein a density of the scattering structures in the scattering layer is in a range from 1 particle/cm$^3$ to $10^{12}$ particles/cm$^3$.

12. The module structure according to claim 3, wherein a surface roughness of the rough surface of the scattering layer is in a range from $1/10$ of a wavelength of visible light to 100 times of the wavelength of the visible light.

13. The module structure according to claim 2, further comprising a periodic or aperiodic microstructure disposed on a surface of the microstructure layer far away from the display component;
   wherein the signal light transmitted through the microstructure layer is at least partially refracted on the microstructure.

14. The module structure according to claim 13, wherein the microstructure is at least one of an inclined surface, a convex surface and a concave surface.

15. The module structure according to claim 1, wherein the display component comprises a substrate, and the scattering layer and the substrate of the display component are formed in one piece.

16. The module structure according to claim 1, wherein the scattering layer is a thin film formed on the display component.

17. The module structure according to claim 1, wherein the sensing component comprises a photosensitive element configured for performing photoelectric conversion on the signal light.

18. The module structure according to claim 17, further comprising: a converging module, disposed between the air layer and the sensing component to converge the signal light.

19. The module structure according to claim 18, wherein the converging module comprises a single lens, and the sensing component comprises a CMOS image sensor.

20. The module structure according to claim 18, wherein the converging module comprises a lens group, and the sensing component comprises a CMOS image sensor or a TFT sensor.

21. The module structure according to claim 1, wherein a thickness of the air layer is less than or equal to 1 mm.

22. The module structure according to claim 1, further comprising: at least one spacer, disposed between the scattering layer and the sensing component to form the air layer.

23. The module structure according to claim 22, further comprising: a plurality of spacers, evenly distributed in a plane parallel to a surface of the sensing component.

24. The module structure according to claim 22, wherein further comprising: a plurality of spacers, wherein the plurality of spacers comprise a first spacer and a second spacer, and the first spacer and the second spacer have different heights.

25. The module structure according to claim 1, wherein the display component comprises a display panel, and the sensing component comprises an image sensor panel.

26. The module structure according to claim 1, wherein the display component comprises a light-transmitting cover plate and a display layer, and the sensing surface is a surface of the light-transmitting cover plate.

27. An electronic apparatus, comprising the module structure according to claim 1.

28. The electronic apparatus according to claim 27, wherein the electronic apparatus comprises a mobile phone, a tablet computer, or a smart watch.

\* \* \* \* \*